United States Patent
Armbruster et al.

(10) Patent No.: US 9,490,137 B2
(45) Date of Patent: Nov. 8, 2016

(54) METHOD FOR STRUCTURING A LAYERED STRUCTURE FROM TWO SEMICONDUCTOR LAYERS, AND MICROMECHANICAL COMPONENT

(71) Applicant: Robert Bosch GmbH, Stuttgart (DE)

(72) Inventors: Simon Armbruster, Wannweil (DE); Frank Fischer, Gomaringen (DE); Johannes Baader, Wannweil (DE); Rainer Straub, Ammerbuch (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/616,004

(22) Filed: Feb. 6, 2015

(65) Prior Publication Data

US 2015/0235859 A1 Aug. 20, 2015

(30) Foreign Application Priority Data

Feb. 17, 2014 (DE) .................. 10 2014 202 845

(51) Int. Cl.
*H01L 21/311* (2006.01)
*H01L 21/02* (2006.01)
*B81C 1/00* (2006.01)

(52) U.S. Cl.
CPC ......... *H01L 21/311* (2013.01); *B81C 1/00801* (2013.01); *H01L 21/0228* (2013.01); *H01L 21/02118* (2013.01); *H01L 21/02164* (2013.01); *H01L 21/02178* (2013.01); *H01L 21/02271* (2013.01); *H01L 21/02274* (2013.01); *B81C 2201/014* (2013.01)

(58) Field of Classification Search
CPC ...................... H01L 21/3065; H01L 21/31116; H01L 21/32136; H01L 21/67069; H01L 21/67213; H01L 37/32422; H01L 37/32458; H01L 37/32623; H01L 21/311; H01L 21/02118; H01L 21/02164; H01L 21/02178; H01L 21/02274; H01L 21/0228
See application file for complete search history.

(56) References Cited

U.S. PATENT DOCUMENTS 6,074,890 A * 6/2000 Yao ................... B81C 1/00484
438/24
2001/0000034 A1* 3/2001 Tsai ................... H01L 21/0276
438/638

FOREIGN PATENT DOCUMENTS

DE 60 2004 008 537 T2 12/2007
DE 11 2008 000 218 T5 12/2009

* cited by examiner

*Primary Examiner* — Duy Deo
(74) *Attorney, Agent, or Firm* — Norton Rose Fulbright US LLP; Gerard Messina

(57) ABSTRACT

A method for structuring a layered structure, for example, of a micromechanical component, from two semiconductor layers between which an insulating and/or etch stop layer is situated includes forming a first etching mask on a first side of the first semiconductor layer, carrying out a first etching step, starting from a first outer side, for structuring the first semiconductor layer, forming a second etching mask on a second side of the second semiconductor layer, and carrying out a second etching step, starting from the second outer side, for structuring the second semiconductor layer. After carrying out the first etching step and prior to carrying out the second etching step, at least one etching protection material is deposited on at least one trench wall of at least one first trench, which is etched in the first etching step.

6 Claims, 3 Drawing Sheets

METHOD FOR STRUCTURING A LAYERED STRUCTURE FROM TWO SEMICONDUCTOR LAYERS, AND MICROMECHANICAL COMPONENT

FIELD OF THE INVENTION

The present invention relates to a method for structuring a layered structure from two semiconductor layers between which an insulating and/or etch stop layer is situated. Moreover, the present invention relates to a method of manufacturing a micromechanical component. Furthermore, the present invention relates to a micromechanical component.

BACKGROUND

DE 60 2004 008 537 T2 and DE 11 2008 000 218 T5 describe methods for manufacturing an SOI substrate. An SOI substrate manufactured in this way is frequently a starting material for the manufacture of micromechanical components. In this case, a micromechanical component is usually manufactured by structuring the substrate and the silicon layer, which is electrically insulated from the substrate with the aid of an insulating and/or etch stop layer situated in between.

SUMMARY

The present invention provides a method for structuring a layered structure from two semiconductor layers between which an insulating and/or etch stop layer is situated, provides a method of manufacturing a micromechanical component, and provides a micromechanical component.

The present invention allows more reliable protection for components that are structured from a first semiconductor layer during a second etching step for structuring a second semiconductor layer. Etching/damage of the structures formed in a first etching step is thus prevented in the subsequent processes. With the aid of the present invention, the desired component properties may thus be achieved more reliably during manufacture of a micromechanical component.

In addition, the present invention ensures that there is additional protection of the structures formed from the layered structure, also during subsequent wafer processes such as further etching processes. For example, damage of the micromechanical component, which is structured from the layered structure, may thus also be prevented during a separation process, a packaging process, and/or transport.

In an example embodiment, during the performance of the method, after carrying out the first etching step and prior to carrying out the second etching step, at least one etching protection material is deposited on at least one trench wall and at least one trench floor of at least one first trench, on a first etching mask, and/or on a first side of the first semiconductor layer. Numerous deposition processes known from the related art may thus be utilized for depositing the at least one etching protection material.

For example, prior to the second etching step, the at least one trench floor of the at least one first trench, the first etching mask, and/or the first side of the first semiconductor layer is/are exposed by the at least one etching protection material with the aid of an anisotropic etching step which is carried out from a first outer side. If desired, exposed subareas of the insulating and/or etch stop layer may also be removed on the at least one trench floor of the at least one first trench with the aid of the anisotropic etching step which is carried out from the first outer side. Due to the joint removal of the at least one etching protection material (from the at least one trench floor of the at least one first trench, the first etching mask, and/or the first side of the first semiconductor layer) together with the exposed subareas of the insulating and/or etch stop layer in a single etching step, the number of etching steps to be carried out for manufacturing a micromechanical component may be reduced.

A $CF_4$-based plasma etching step or a $BCl_3$-based plasma etching step is preferably carried out as the anisotropic etching step. These types of etching processes can be easily and reliably carried out.

In addition, in an example embodiment, after the second etching step, at least one subarea of the insulating and/or etch stop layer, which is exposed on the at least one second trench, is removed with the aid of a further etching step. However, if removal of the subarea of the insulating and/or etch stop layer, which is exposed on the at least one second trench, is not necessary, this further etching step can be dispensed with.

In an example embodiment, after carrying out the first etching step and prior to carrying out the second etching step, aluminum oxide, silicon dioxide, and/or Teflon, as the at least one etching protection material, is/are deposited on at least the one trench wall of the at least one first trench. The materials listed here are well suited for the at least one etching protection material for preventing etching/damage of at least the one trench wall of the at least one first trench during at least the second etching step.

After carrying out the first etching step and prior to carrying out the second etching step, the at least one etching protection material is preferably deposited on at least the one trench wall of the at least one first trench with the aid of atomic layer deposition, chemical gas phase deposition, and/or plasma-assisted chemical gas phase deposition. The deposition processes mentioned here may be easily carried out, and ensure reliable coverage, in particular complete coverage with sufficient layer thickness, for preventing etching of at least the one trench wall of the at least one first trench during at least the second etching step.

The advantages listed above are also ensured when a corresponding manufacturing method for a micromechanical component is carried out.

In addition, the described advantages are also ensured for a micromechanical component designed with at least one subcomponent that includes a first semiconductor area and a second semiconductor area with at least one insulating area situated between the first semiconductor area and the second semiconductor area, the first semiconductor area being structured with the aid of at least one first trench that extends through the first semiconductor area from a first side of the first semiconductor area facing away from the insulating area and the second semiconductor area, and the second semiconductor area being structured with the aid of at least one second trench that extends through the second semiconductor area on a second side of the second semiconductor area facing away from the insulating area and the first semiconductor area, and at least one trench wall of the at least one first trench being covered with aluminum oxide, silicon dioxide, and/or Teflon, while at least one trench wall of the at least one second trench is exposed.

Further example features and advantages of the present invention are explained below with reference to the figures.

DETAILED DESCRIPTION

FIGS. 1a-1d show schematic cross sections for explaining an example method for structuring a layered structure from two semiconductor layers between which an insulating and/or etch stop layer is situated.

Figure 1A:
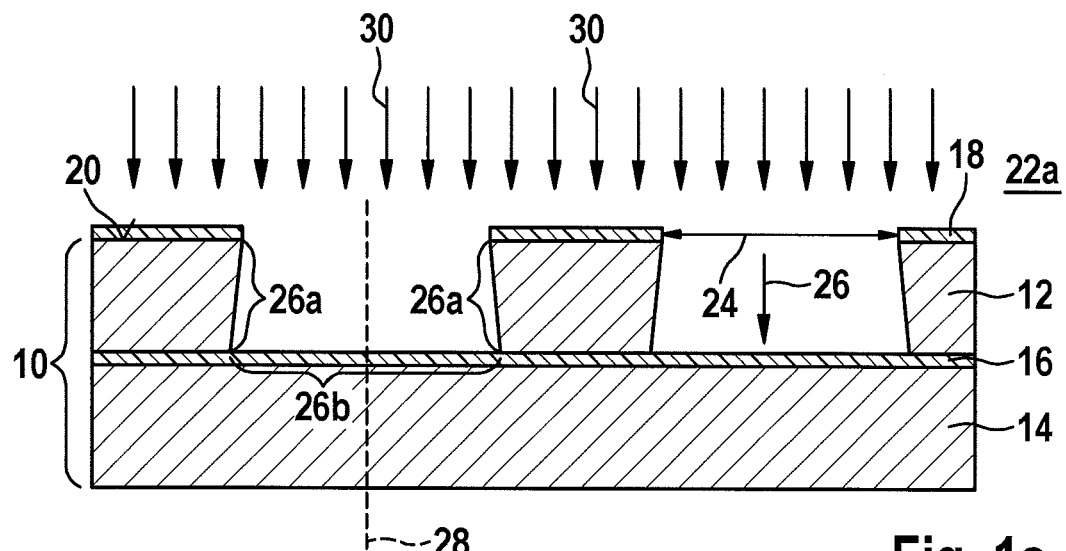
FIGS. 1a-1d show schematic cross sections for explaining an example method for structuring a layered structure from two semiconductor layers between which an insulating and/or etch stop layer is situated, according to an example embodiment of the present invention.

The cross section schematically illustrated in FIG. 1a shows a layered structure 10 made up of the two semiconductor layers 12 and 14 between which an insulating and/or etch stop layer 16 is situated. The first and semiconductor layers 12 and 14 can include silicon, for example. In particular, at least one of the two semiconductor layers 12 and 14 can be a silicon layer.

For example, layered structure 10 may be a silicon on insulator (SOI) substrate. However, it is pointed out that the practicability of the method described below is not limited to the use of an SOI substrate as layered structure 10, or to the structuring of at least one silicon layer as semiconductor layers 12 and 14. Therefore, at least one of semiconductor layers 12 and 14 can include a different semiconductor material instead of or in addition to silicon. At least one of semiconductor layers 12 and 14 can also include at least one doping, at least one insulating area, and/or at least one metal plating, such as at least one contact and/or at least one printed conductor. A layer thickness of semiconductor layers 12 and 14 used for carrying out the method described below is relatively freely selectable. Only as an example, one of the two semiconductor layers 12 and 14 can also be a substrate/wafer.

In an example embodiment, insulating and/or etch stop layer 16 preferably includes at least one electrically insulating material. Insulating and/or etch stop layer 16 can be a silicon dioxide layer, for example. However, it is pointed out that the practicability of the method is not limited to a specific material of insulating and/or etch stop layer 16.

For carrying out the method for structuring layered structure 10, a first etching mask 18 is formed on a first side 20 of first semiconductor layer 12 of the two semiconductor layers 12 and 14. First side 20 is understood to mean an interface of first semiconductor layer 12 that is situated on a first outer side 22a of layered structure 10 and that faces away from insulating and/or etch stop layer 16. First etching mask 18 can be formed directly or indirectly on/across first side 20 of first semiconductor layer 12. First outer side 22a of layered structure 10 may be understood in particular to mean a front side or a rear side of layered structure 10.

First etching mask 18 is formed with at least one continuous recess 24, so that at least one subsurface of first side 20 is exposed (not shown) by first etching mask 18. Numerous known materials can be used for first etching mask 18. The structuring of first etching mask 18 can take place, for example, with the aid of standard lithographic steps.

Subsequently, a first etching step, starting from first outer side 22a, for structuring first semiconductor layer 12 is carried out. During the first etching step, at least one first trench 26, which passes through first semiconductor layer 12, is etched on the at least one subsurface of first side 20 of first semiconductor layer 12, which is exposed by first etching mask 18. The at least one first trench 26, which passes through first semiconductor layer 12, can have, for example, an associated first center longitudinal axis 28, which is oriented perpendicularly with respect to first side 20 of first semiconductor layer 12. A width of the at least one first trench 26 oriented perpendicularly with respect to first center longitudinal axis 28 can, for example, be constant or can (slightly) increase, starting from first side 20 up to insulating and/or etch stop layer 16.

The at least one first trench 26 is formed with at least one trench wall 26a, which is made of at least one material of first semiconductor layer 12. The at least one trench wall 26a of the at least one first trench 26 can be oriented perpendicularly with respect to first side 20 of first semiconductor layer 12. For a width of the at least one first trench 26 that (slightly) increases, starting from first side 20 up to insulating and/or etch stop layer 16, the at least one trench wall 26a of the first trench can also have a slightly receding design.

The first etching step can be, in particular, an anisotropic etching step. A first etching material 30, which is used for carrying out the first etching step, can be selected from a number of known etching materials. The first etching step is preferably carried out using a first etching material 30 to which insulating and/or etch stop layer 16 is (virtually) resistant. Insulating and/or etch stop layer 16 can thus be utilized as a stop layer/etch stop layer in the first etching step. Preferably, after the first etching step, at least one subsurface of insulating and/or etch stop layer 16 is exposed at at least one trench floor 26b of the at least one first trench 26. Second semiconductor layer 14 is preferably still unetched after the first etching step is carried out. FIG. 1a shows layered structure 10 after the at least one first trench 26 is etched.

Figure 1B:
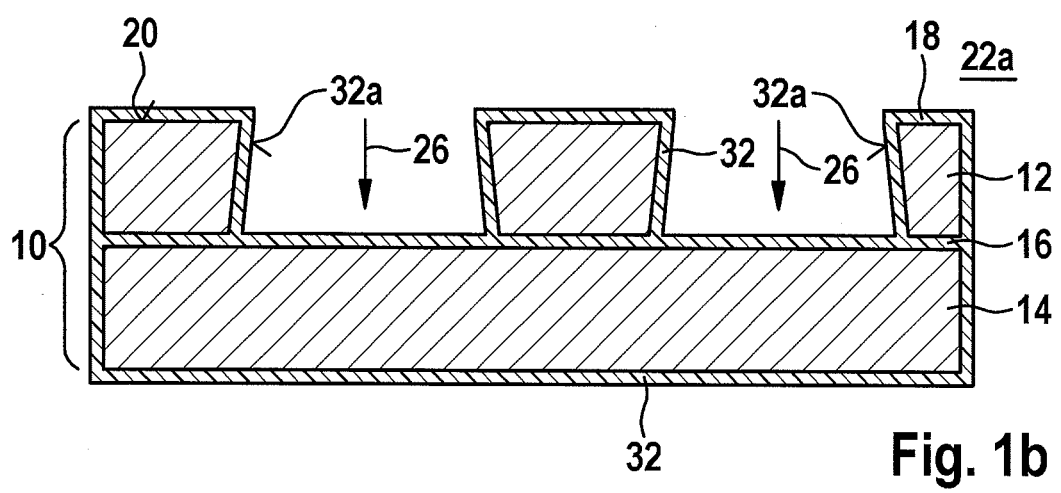

In an example, after the first etching step is carried out and before a second etching step (described below) is carried out, at least one etching protection material 32 is deposited on at least one trench wall 26a of the at least one first trench 26, as schematically illustrated in FIG. 1b.

For example, after carrying out the first etching step and prior to carrying out the second etching step, aluminum oxide ($Al_2O_3$), silicon dioxide ($SiO_2$), and/or Teflon (polytetrafluoroethylene), as the at least one etching protection material 32, is deposited on at least the one trench wall 26a of the at least one first trench 26. The materials mentioned here are well suited as etching protection material 32 for preventing etching of semiconductor surfaces covered in this way.

The deposition of the at least one etching protection material 32, carried out after carrying out the first etching step and prior to carrying out the second etching step, can take place, for example, with the aid of atomic layer deposition and/or chemical vapor deposition. With the aid of these deposition processes, in particular aluminum oxide and silicon dioxide can be easily deposited on at least the one trench wall 26a of the at least one first trench 26. The at least one etching protection material 32 can also be deposited on at least the one trench wall 26a of the at least one first trench 26 with the aid of plasma-enhanced chemical vapor deposition. A TEOS oxide can thus also be used as the at least one etching protection material 32.

All deposition processes listed here are compliant deposition processes, and thus allow complete coverage, even of a trench wall 26a that is oriented perpendicularly with respect to first side 20 or that slightly recedes, with a layer thickness that is sufficient for etching protection. Even a trench wall 26a of a structure with a comparatively small trench width or a structure with difficult access can be covered with the at least one etching protection material 32 in a reliable/compliant manner with the aid of one of the above-mentioned deposition processes. The options listed above for the at least one etching protection material 32 are to be understood only as examples. Numerous other materials may likewise be used for the at least one etching protection material 32.

The covering of the at least one trench wall 26 with the at least one etching protection material 32 is generally understood to mean incomplete filling of the at least one first trench 26. An inner cavity, which extends along a subsection of first center longitudinal axis 28 is preferably present in the at least one first trench 26, even after covering the at least one trench wall 26a with the at least one etching protection material 32. Likewise, the covering of the at least one trench wall 26a of the at least one first trench 26 with the at least one etching protection material 32 is understood to mean a lack of electrical trench wall passivation. Therefore, at least one outer interface 32a of a covering, which is formed from the at least one etching protection material 32 and which delimits the inner cavity, is preferably present in uncovered/exposed form during the method steps described below.

In the example embodiment of FIGS. 1a-1d, first etching mask 18 remains on first side 20 and is likewise covered by the at least one etching protection material 32. Optionally, however, first etching mask 18 can be removed before the at least one etching protection material 32 is deposited. In this case, the at least one etching protection material 32 is also deposited on first side 20 of first semiconductor layer 12. In addition, the at least one trench floor 26b of the at least one first trench 26 can also be covered in this way during deposition of the at least one etching protection material 32. Furthermore, at least one outer surface of layered structure 10 can also be covered by the at least one etching protection material 32.

Figure 1C:
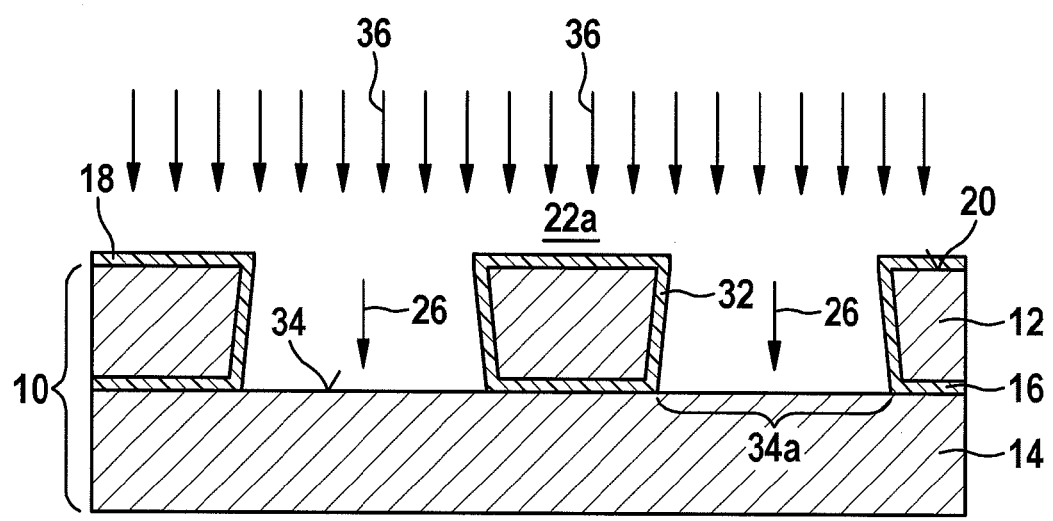

FIG. 1c shows an optional anisotropic etching step, which, however, can also be dispensed with in carrying out the method. The at least one trench floor 26b of the at least one first trench 26, first etching mask 18, and/or first side 20 of first semiconductor layer 12 can be exposed by the at least one etching protection material 32 with the aid of the anisotropic etching step. In addition, exposed subareas of insulating and/or etch stop layer 16 can be removed at the at least one trench floor 26b of the at least one first trench 26 with the aid of the anisotropic etching step. At least one subsurface 34a of an inner side 34 of second semiconductor layer 14, which is oriented toward insulating and/or etch stop layer 16, may be exposed in this way. The anisotropic etching step is carried out from first outer side 22a. Due to a sufficiently high anisotropy of the anisotropic etching step, it can be ensured that the at least one etching protection material 32 remains on at least the one trench wall 26a of the at least one first trench 26, while the at least one etching protection material 32 is removed from the desired surfaces.

In an example embodiment, an etching material 36, which etches the at least one etching protection material 32 as well as the at least one material of insulating and/or etch stop layer 16, is used for carrying out the anisotropic etching step. The anisotropic etching step can be, for example, a tetrafluoromethane ($CF_4$)-based plasma etching step or a $BCl_3$-based plasma etching step. However, the options mentioned here for a suitable etching material 36 for carrying out the anisotropic etching step are examples.

The anisotropic etching step can be carried out, provided that electrical access from first outer side 22a is providable, or if a covering of first etching mask 18/first side 20 interferes with a subsequent process (such as a wafer bonding process, for example). With the aid of the anisotropic etching step, it can be ensured that no disadvantages have to be accepted in order to make use of the advantages described below of depositing the at least one etching protection material 32 on at least the one trench wall 26a of the at least one first trench 26.

In the method described here, a second etching mask 38 is also formed on a second side 40 of second semiconductor layer 14. Second side 40 is understood to mean an interface of second semiconductor layer 14 that is situated on a second outer side 22b of layered structure 10 and that faces away from insulating and/or etch stop layer 16. In addition, second outer side 22b of layered structure 10 can be understood to mean a front side of layered structure 10 (with first outer side 22a as the rear side), or a rear side of layered structure 10 (with first outer side 22a as the front side). Second etching mask 38 can be formed directly or indirectly on/across second side 40 of semiconductor layer 14. The formation of second etching mask 38 can take place prior to or after carrying out the first etching step.

With the aid of at least one continuous recess 42 of second etching mask 38, at least one subsurface of second side 40 of second semiconductor layer 14 is exposed (not shown). Numerous known materials can also be used for second etching mask 38. Likewise, the structuring of second etching mask 38 can take place with the aid of standard lithographic steps.

Figure 1D:
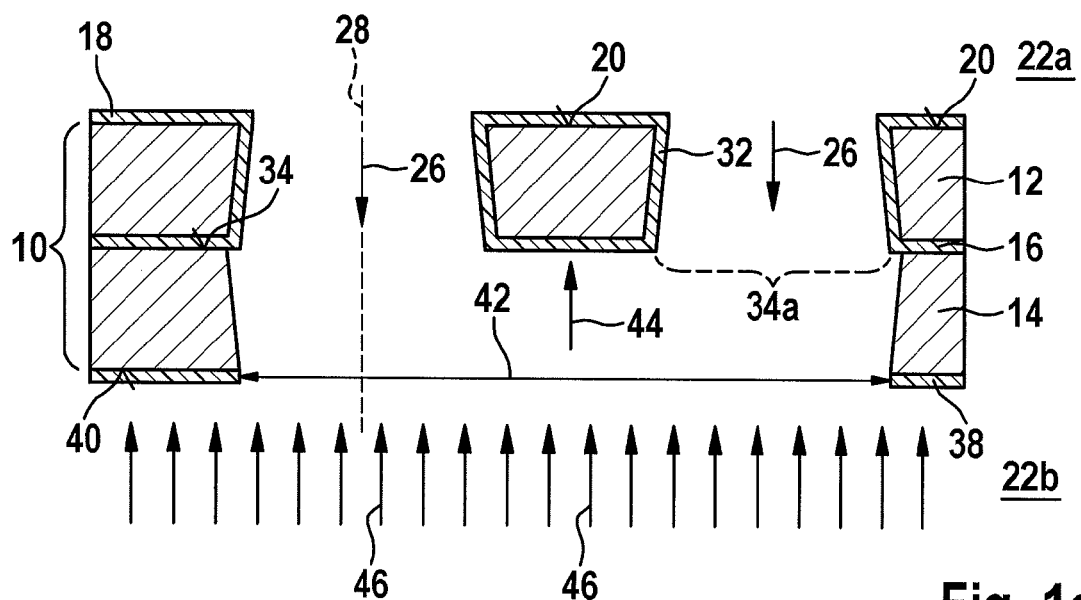

FIG. 1d shows a representation of second etching step, which, starting from second outer side 22b of layered structure 10 for structuring second semiconductor layer 14, is carried out after the first etching step and the formation of second etching mask 38. With the aid of the second etching step, at least one second trench 44, which passes through second semiconductor layer 14, is etched at the at least one subsurface of second side 40 of second semiconductor layer 14, which is exposed by second etching mask 38. During the second etching step, at least the one trench wall 26a of the at least one first trench 26 remains covered due to an etch resistance of the at least one etching protection material 32 to a second etching material 46 used for carrying out the second etching step. Protection of at least the one trench wall 26a of the at least one first trench 26 from an etching attack during the second etching step is ensured in this way.

The method described here thus achieves "wrapping" of sensitive structures formed from first semiconductor layer 12 in a protective layer/protective covering, made of the at least one etching protection material 32, during the second etching step. With the aid of the at least one etching protection material 32, it may be ensured that no etching/damage of a structure, which is structured from first semiconductor layer 12 with the aid of the at least one first trench 26, takes place during the second etching step. This ensures improved protection for structures, which are already structured from first semiconductor layer 12 with the aid of the first etching step, during the second etching step for structuring second semiconductor layer 14. In particular, compared to the conventional use of only side wall passivation, improved protection is ensured with the aid of the at least one etching protection material 32.

In addition, with the aid of the method described here, improved protection for the structures, which are already structured from first semiconductor layer 12 with the aid of the first etching step, in further subsequent processes is made possible. Even with a major exposure to heat in a subsequent process, there is no concern for an etching attack on the structures to be protected. Therefore, undesirable weakening of the structures formed from first semiconductor layer 12 does not have to be accepted, even after carrying out the second etching step. Thus, with the aid of the method described here, reproducible results may be achieved even in complex processes.

For carrying out the second etching step, a second etching material 46, to which the at least one etching protection material 32 has a high etch resistance, is preferably used. The structures that are covered with the aid of the at least one etching protection material 32 during the second etching step thus remain unetched/undamaged, even for a comparatively long duration of the second etching step.

The advantages described above are also ensured when material of the second semiconductor layer 14 is removed at the at least one exposed subsurface 34a of inner side 34 with the aid of the at least one second trench 44. Providing at least one opening between the at least one first trench 26 and the at least one second trench 44 is thus completely unproblematic. Even if the position of trenches 26 and 44 is fixed in such a way that the at least one first center longitudinal axis 28 of the at least one first trench 26 extends through the at least one second trench 44, and/or at least one second center longitudinal axis (not illustrated) of the at least one second trench 44 extends through the at least one first trench 26, it is still ensured that no etching damage occurs during the second etching step, at the at least one trench wall 26a of the at least one first trench 26. It is pointed out once again that the at least one outer interface 32a (which delimits the inner cavity of the at least one first trench 26) of the covering made of the at least one etching protection material 32 can be uncovered/exposed during the second etching step.

In one refinement, after the second etching step, at least one subarea of insulating and/or etch stop layer 16 that is exposed at the at least one second trench 44 can be removed with the aid of a further etching step. The further etching step can be carried out from second outer side 22b.

The advantages described above are also ensured in a manufacturing method for a micromechanical component, at least one subcomponent of the micromechanical component being structured from layered structure 10 made up of the two semiconductor layers 12 and 14 with insulating and/or etch stop layer 16 situated between the layers 12 and 14.

Figure 2:
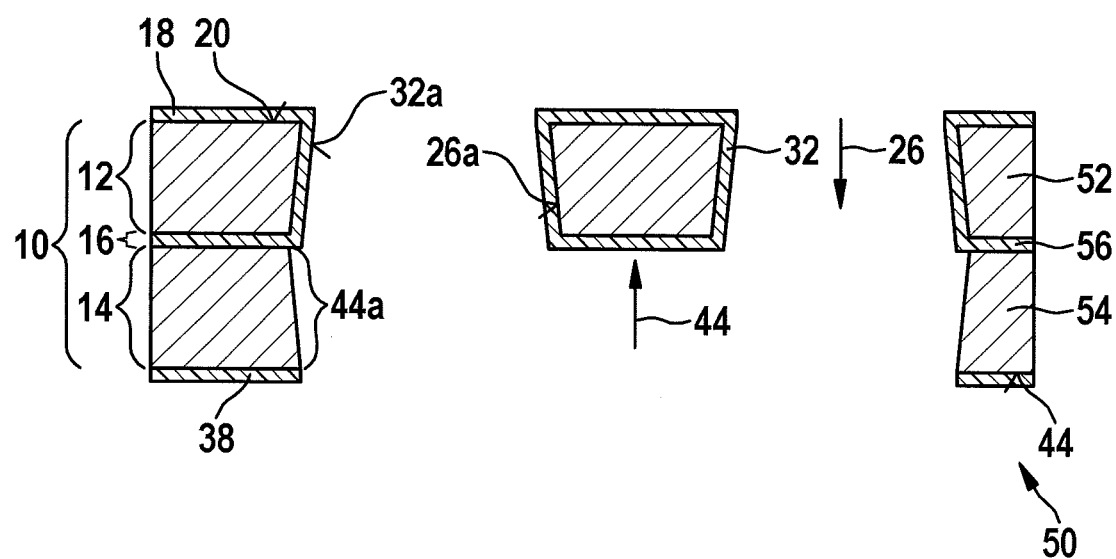
FIG. 2 shows a schematic cross section of a micromechanical component, according to an example embodiment of the present invention.

FIG. 2 shows a schematic cross section of a micromechanical component, according to an example embodiment. The micromechanical component depicted in part in FIG. 2 includes at least one subcomponent 50 that includes a first semiconductor area 52 and a second semiconductor area 54, with at least one insulating area 56 situated between first semiconductor area 52 and second semiconductor area 54. Subcomponent 50 can be, for example, a subunit of a micromirror.

Areas 52-56 can be structured, for example, from layered structure 10 described above. First semiconductor area 52 is structured with the aid of at least one first trench 26, which extends through first semiconductor area 52 from a first side 20 of first semiconductor area 52 facing away from insulating area 56 and second semiconductor area 54. Second semiconductor area 54 is similarly structured with the aid of at least one second trench 44, which extends through second semiconductor area 54 from a second side 40 of second semiconductor area 54 facing away from insulating area 56 and first semiconductor area 52. (Etching masks 18 and 38 can optionally be situated on sides 20 and 40, respectively.) In addition, at least one trench wall 26a of the at least one first trench 26 is covered with aluminum oxide 32 ($Al_2O_3$), silicon dioxide ($SiO_2$), and/or Teflon (polytetrafluoroethylene). In contrast, at least one trench wall 44a of the at least one second trench 44 is exposed. The aluminum oxide, silicon dioxide, and/or Teflon can be detected, for example, with the aid of a cross section or an REM analysis of at least the one trench wall 26a of the at least one first trench 26. It can thus be demonstrated that at least subcomponent 50 is manufactured with the aid of a specific embodiment of the method explained above.

What is claimed is:

1. A method for structuring a layered structure from two semiconductor layers between which an intermediary layer is situated, the intermediary layer being at least one of an insulating layer and an etch stop layer, the method comprising:

forming a first etching mask on a side of a first one of the semiconductor layers that is situated on a first outer side of the layered structure and that faces away from the intermediary layer, a portion of the side of the first semiconductor layer being exposed by an opening in the first etching mask;

carrying out a first etching step, starting from the first outer side, which structures the first semiconductor layer, at least one first trench that passes through the first semiconductor layer to the intermediary layer being etched through at least one subsurface of the side of the first semiconductor layer at the exposed portion of the side of the first semiconductor layer, at least one floor of the at least one first trench formed from an subarea of the intermediary layer as exposed by the first etching step;

forming a second etching mask on a side of a second one of the semiconductor layers that is situated on a second outer side of the layered structure and that faces away from the intermediary layer, a portion of the side of the second semiconductor layer being exposed by an opening in the second etching mask; and carrying out a second etching step, starting from the second outer side, which structures the second semiconductor layer, at least one second trench that passes through the second semiconductor layer being etched through at least one subsurface of the side of the second semiconductor layer at the exposed portion of the side of the second semiconductor layer; and between the carrying out of the first and second etching steps, depositing at least one etching protection material on at least one trench wall of the at least one first trench, the at least one trench wall of the at least one first trench remaining covered during the second etching step due to an etch resistance of the at least one etching protection material;

wherein, between the carrying out of the first and second etching steps: i) at least one etching protection material is deposited on at least one of the side of the first semiconductor layer, the first etching mask, and the exposed subarea of intermediary layer forming the at least one trench floor of the at least one first trench, and ii) performing an anisotropic etching of the at least one etching protection material from the first outer side to expose the at least one trench floor of the at least one first trench.

2. The method of claim 1, wherein a $CF_4$-based plasma or a $BCl_3$-based plasma is used for the anisotropic etching.

3. The method of claim 1, further comprising, subsequent to the second etching step, carrying out a third etching step by which at least one subarea of the intermediary layer, which is exposed at the at least one second trench, is removed.

4. The method of claim 1, wherein the at least one etching protection material includes at least one of aluminum oxide, silicon dioxide, and Teflon.

5. The method of claim 1, wherein the depositing is performed using at least one of atomic layer deposition, chemical gas phase deposition, and plasma-assisted chemical gas phase deposition.

6. The method of claim 1, wherein the layered structure forms at least one subcomponent of a micromechanical component.

\* \* \* \* \*